(12) United States Patent
Bond

(10) Patent No.: US 7,524,196 B2
(45) Date of Patent: Apr. 28, 2009

(54) FAST CONNECTING/DISCONNECTING ELEMENT FOR COMPONENT MOUNTED ON A PCB

(76) Inventor: William H. Bond, 11 Lansdowne Road, Felixstowe, Suffolk IP11 9HG (GB)

( * ) Notice: Subject to any disclaimer, the term of this patent is extended or adjusted under 35 U.S.C. 154(b) by 0 days.

(21) Appl. No.: 11/717,780

(22) Filed: Mar. 13, 2007

(65) Prior Publication Data
US 2007/0249190 A1  Oct. 25, 2007

(30) Foreign Application Priority Data
Apr. 4, 2006  (GB) .................... 0606815.9

(51) Int. Cl.
*H01R 9/09* (2006.01)
(52) U.S. Cl. .................. 439/92; 439/575; 24/546; 24/457; 24/458; 361/801; 361/802
(58) Field of Classification Search .......... 24/546, 24/457, 458; 361/801, 802; 439/92, 575, 439/574
See application file for complete search history.

(56) References Cited

U.S. PATENT DOCUMENTS

| 2,697,579 | A |  | 12/1954 | Whithy |
| 4,575,038 | A |  | 3/1986 | Moore .................. 248/515 |
| 4,623,206 | A |  | 11/1986 | Fuller ..................... 439/81 |
| 5,726,859 | A |  | 3/1998 | Khadem et al. ........... 361/760 |
| 6,434,004 | B1 | * | 8/2002 | Matteson ............... 361/704 |
| 6,518,507 | B1 | * | 2/2003 | Chen ..................... 174/252 |
| 6,992,893 | B2 | * | 1/2006 | Miyamura et al. ........ 361/705 |
| 2003/0016501 | A1 | * | 1/2003 | Chen ..................... 361/704 |
| 2004/0017662 | A1 | * | 1/2004 | Liu ...................... 361/719 |
| 2004/0052478 | A1 |  | 3/2004 | Minamino |

FOREIGN PATENT DOCUMENTS

JP  07122314  10/1993

OTHER PUBLICATIONS

Search Report dated Aug. 1, 2006.
Search Report dated Sep. 15, 2008.
IBM Technical Disclosure Bulletin vol. 24 No. 1A Jun. 1981.

* cited by examiner

*Primary Examiner*—Gary F. Paumen
(74) *Attorney, Agent, or Firm*—Sofer & Haroun, LLP

(57) ABSTRACT

A connecting/disconnecting element (6*a*; 6*b*) for retaining a component (1) on a PCB (3), said connecting/disconnecting element (6*a*; 6*b*) comprising at least one longitudinal arm (61*a*, 62*a*; 61*b*) with a first end (63*a*; 63*b*) adapted to engage through a hole (30) in said PCB (3), and a second opposite end (64*a*; 64*b*), said element being adapted to clip onto said PCB (3) whilst bridging component (1) with said longitudinal arm extending in a retaining position parallel to the plane of the PCB and to a top surface of said component. According to the invention, said element is made of electrical conductive material, said longitudinal arm is (61*a*, 62*a*; 61*b*) adapted to be in contact, in said retaining position, with an electrical conductive part of said top surface, and said hole (30) is a plated through hole with which said first end (63*a*; 63*b*) is adapted to be in contact with in said retaining position, thus achieving both mechanical holding of component and electrical connection to ground. One application is to a utility metering device with a removable modem.

22 Claims, 2 Drawing Sheets

FAST CONNECTING/DISCONNECTING ELEMENT FOR COMPONENT MOUNTED ON A PCB

RELATED APPLICATION

This application is related to and claims the benefit of priority from United Kingdom Patent Application No. 0606815.9, filed on Apr. 4, 2006, the entirety of which is incorporated herein by reference.

FIELD OF THE INVENTION

The present invention relates to fast connecting/disconnecting elements for retaining components which have to be mechanically held on and electrically connected to a printed circuit board.

The present invention concerns more particularly all type of electrical devices including PCB with several components, at least one component being connected both mechanically and electrically to the PCB in a removable manner.

Many situations can occur in which components may need to be easily and rapidly removed from or mounted on a PCB. For instance, in the non-limitative case of a utility metering device equipped with a modem for communication via radio link, it may be necessary to remove the modem for maintenance, e.g. reparation and/or software updating and/or replacement with another modem.

However in this case, solutions must be found which enable to mechanically retain components such as Modem's to PCB's where connectors are utilized, in order to guarantee electrical connection, even after rough handling/transport of the device, between any ground point on the component and the host PCB.

Today, a known solution for retaining such components consists of using on one hand plastic clips for mechanically holding the component, and on the other hand, a ground electrical connection that consists of a threaded bush which is fixed to the PCB, the component being then connected to this bush via a small screw. FIG. 1 shows schematically a cross section in the plane of a plastic clip, and in the plane of a screw, of a component or modem 1, optionally provided with a connector 2, mounted on the surface of a PCB 3 according to this known solution. Electrical connection to ground is provided through a threaded bush 4 in cooperation with a grounding screw 5. This is also made possible because the external housing of component 1 is made of electrically conducting material, for the purpose of electromagnetic shielding. Screw 5 does not however guarantee by itself a secured mechanical holding of component 1. Consequently, an additional retainer in form of a plastic clip 6 is used to mechanically clip component 1 on PCB 3.

This known solution has however several drawbacks. First, the plastic clips are usually quite big and have a complex shape (not shown on FIG. 1 which is only a cross section view), therefore utilizing a large area on the PCB and they are also quite expensive. In addition, threaded bush 4 and corresponding screw 5 are also expensive to purchase. At last, the operation which is needed either to remove the component or to mount on PCB is not very easy to perform. The manipulation can take time, which raises also the maintenance costs for a final consumer.

OBJECTS AND SUMMARY

An aim of the present invention is to provide an efficient and economical solution to the above-mentioned drawbacks.

To this aim, a first aspect of the invention is a connecting/disconnecting element for retaining a component on a PCB, said connecting/disconnecting element comprising at least one longitudinal arm with a first end adapted to engage through a hole in said PCB, and a second opposite end, said element being adapted for removal clip onto said PCB whilst bridging the component with said longitudinal arm extending in a retaining position parallel to the plane of the PCB and to a top surface of said component, characterized in that said element is made of electrical conductive material, in that said longitudinal arm is adapted to be in contact, in said retaining position, with an electrical conductive part of said top surface, and in that said hole has an electrically conductive surface (e.g. it is a plated through hole) with which said first end is adapted to be in contact with in said retaining position, thus achieving both mechanical holding of component and electrical connection to ground.

Accordingly, both mechanical retention and electrical ground connection to PCB can be performed through the use of a single electrically conductive clip which is able to electrically link the external electrically conductive housing of component to a ground point of PCB.

In a preferred embodiment, the shape of said first end is preferably adapted to be engaged through said hole and disengaged from said hole only when said longitudinal arm is extending substantially perpendicular to the plane of the PCB.

In a first possible embodiment, said element is made from wire.

In this case, it preferably comprises two longitudinal arms each of which is provided with a first end adapted to be engaged in a corresponding through hole of the PCB.

Alternatively, said element is made from metal strip.

A second aspect of the invention is an electrical device comprising a housing including a PCB with at least one component mechanically held on said PCB and electrically linked to a ground plane of said PCB, and a connecting/disconnecting element for retaining said component on said PCB, said connecting/disconnecting element comprising at least one longitudinal arm with a first end engaged through a hole in said PCB, and a second opposite end, said element being clipped onto said PCB whilst bridging the component with said longitudinal arm extending in a retaining position parallel to the plane of the PCB and to a top surface of said component, characterized in that said hole has an electrically conductive surface (e.g. it is a plated through hole), in that said top surface comprises an electrical conductive part, and in that said connecting/disconnecting element is made of electrical conductive material, said longitudinal arm being in contact, in said retaining position, with said electrical conductive part of said top surface, and said first end being in contact in said retaining position, with said electrically conductive surface of said hole, thus achieving both mechanical holding of the component and electrical connection to ground.

BRIEF DESCRIPTION OF THE DRAWINGS

Features and advantages of the invention will become apparent from the following description of the invention given by way of two preferred non-limiting examples and with reference to the accompanying drawings, in which.

DETAILED DESCRIPTION

Figure 4:
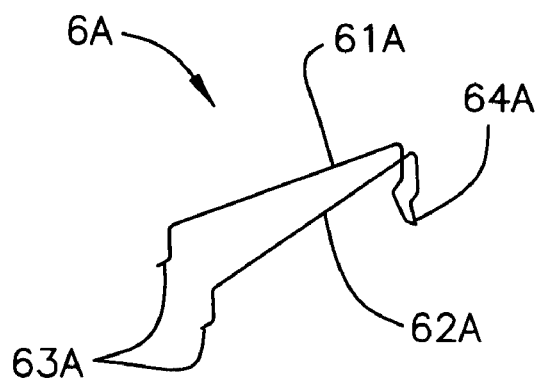
FIG. 4 gives a first possible design of metal clip, corresponding to clip used in FIGS. 2 and 3.
Figure 5:
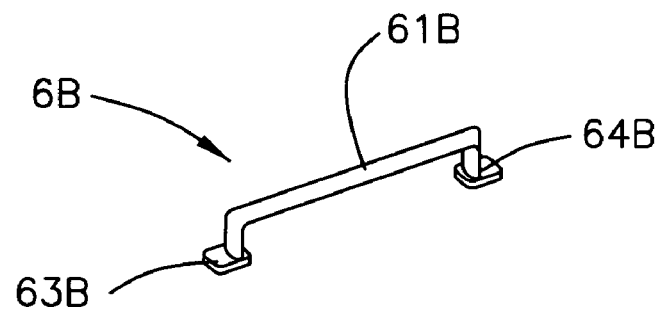
FIG. 5 gives another possible design for the clip according to the invention.

We herein describe two possible designs for the electrically conductor clip, one made from wire (clip 6a on FIGS. 2, 3 and 4) and one made from metal strip (clip 6b on FIG. 5).

Figure 3:
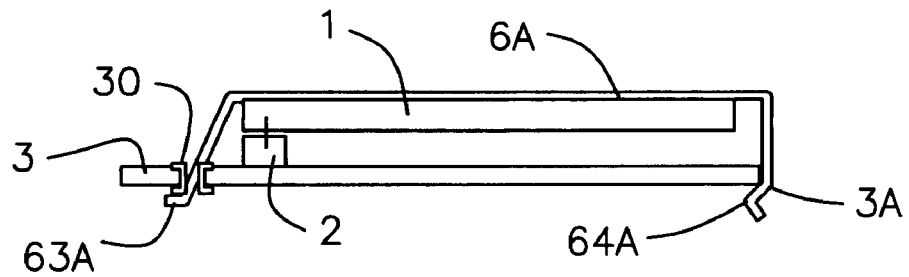
FIG. 3 illustrates schematically in cross section the solution of FIG. 2.

Both connecting/disconnecting elements 6a, 6b however clip onto PCB 3, whilst bridging component 1 (optionally provided with connector 2) thanks to at least one longitudinal arm (61b for clip 6b, but two arms 61a and 62a for clip 6a) which extends parallel to the plane of the PCB and to the top surface of component 1, thereby providing the necessary mechanical retention. By using plated through holes 30 in the PCB for the clip features on the retainer to snap into, it is also possible to achieve electrical connection between the top surface, the ground plane, on the component and the PCB. To this aim, first ends 63a and 63b of clips 6a and 6b can be introduced through corresponding plated through holes 30 (FIG. 3). The electrical connection to ground is made possible because the external housing of component is made of electrical conductive material. It would however be sufficient to provide that at least the part on the top surface of the component which will be in contact with the clip is an electric conductive part. In the particular embodiment shown on the figures, component 1 is preferably to be mounted near to an edge 3a of said PCB 3 thus making easier the mounting and/or the removal of the clip. Second end 64a or 64b of corresponding clip 6a or 6b is thus adapted to clip on this edge 3a. However, we can also envisage, without departing from the scope of the invention, that second end has to cooperate with a slotted hole in the PCB.

The designs in both cases advantageously include one additional feature to prevent the clip from being lost inside the meter, should it become un-clipped. This is achieved thanks to the particular shape given to first ends 63a, 63b that go through the corresponding plated through holes 30 in the PCB, said particular shape being such that clip 6a or 6b has to be assembled initially in the vertical position (or more generally in a perpendicular direction with respect to the PCB's plane), before being hinged to the horizontal position (or more generally to the position parallel to said PCB), prior to the second end 64a or 64b being clipped onto the PCB. Of course, it will be then necessary to foresee that, once the PCB is completely mounted in the device, there is no place left above said PCB to let the clip move back to its vertical position. For instance, for a utility metering device, a cover (not shown) is fitted above PCB 3 with component 1 and clip 6a, 6b, the height under the cover being such that the clip cannot move back to the position in which ends 63a, 63b could be disengaged, should the second end 64a, 64b become un-clipped, thereby providing a safety feature.

Figure 1:
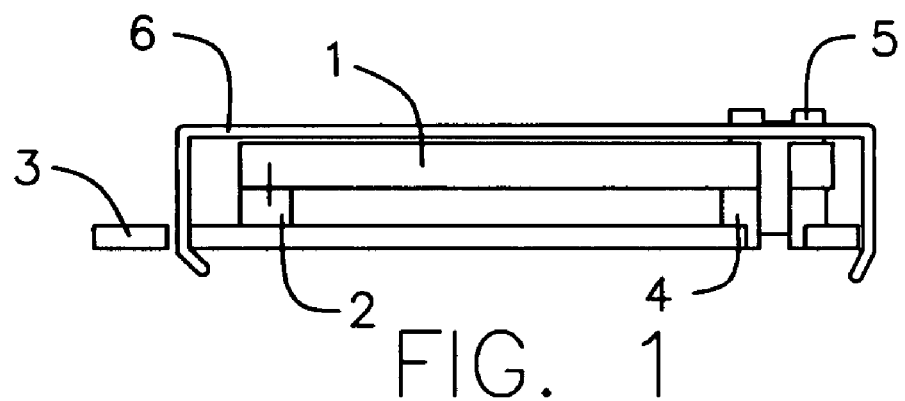
FIG. 1, already discussed above, shows schematically in cross section a solution according to prior art.
Figure 2:
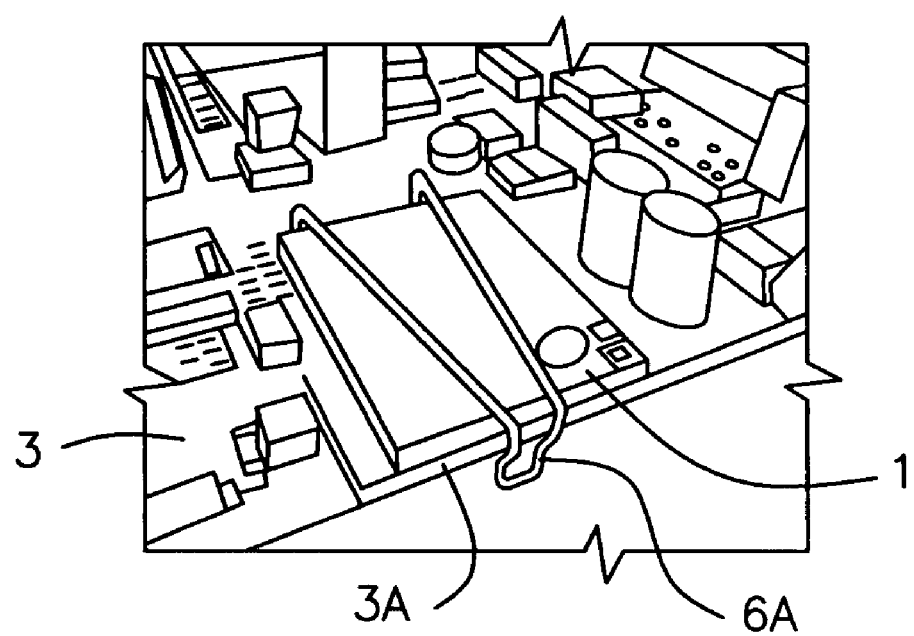
FIG. 2 shows one possible solution according to the present invention, in which a component is in a clipped position on the PCB.

The wire clip 6a of FIGS. 2-4 has the added advantage of being able to apply pressure across the full width of the multi-pin connector, and is also considered easier to manufacture.

A typical use for such a Retaining Clip 6a or 6b would be to retain a Modem to a PCB for a utility electricity meter.

Tests on models of both designs have proved that both work successfully and the meter was able to pass a 1 meter drop test, without the modem becoming loose in its multi pin connector and without loosing electrical grounding.

In addition, the cost of both solutions in terms of material/parts and labour to assemble should provide a significant saving over the conventional solution.

Of course, other applications where there is a need for a fast connecting/disconnecting element can be found.

The invention claimed is:

1. A connecting/disconnecting element for retaining a component on a PCB, said connecting/disconnecting element comprising:
   at least one longitudinal arm with a first end adapted to engage through a plated through hole in said PCB, wherein shape of said first end is adapted to be engaged through said plated through hole and disengaged from said plated through hole only when said longitudinal arm is extending substantially perpendicular to the plane of the PCB, and
   a second opposite end, said element being adapted for removable clip onto said PCB whilst bridging the component with said longitudinal arm extending in a retaining position parallel to the plane of the PCB and to a top surface of said component, wherein said element is made of electrical conductive material, in that said longitudinal arm is adapted to be in contact, in said retaining position, with an electrical conductive part of said top surface, and in that said hole has an electrically conductive surface with which said first end is adapted to be in contact with in said retaining position, thus achieving both mechanical holding of component and electrical connection to ground.

2. A connecting/disconnecting element according to claim 1, wherein said component is to be mounted near to an edge of said PCB, wherein said second opposite end is adapted to clip on said edge.

3. A connecting/disconnecting element according to claim 1, wherein said connecting/disconnecting element is made from wire.

4. A connecting/disconnecting element according to claim 3, wherein said connecting/disconnecting element further comprises two longitudinal arms each of which provided with a first end adapted to be engaged in a corresponding plated through hole of the PCB.

5. A connecting/disconnecting element according to claim 1, wherein said connecting/disconnecting element is made from metal strip.

6. A connecting/disconnecting element according to claim 1, wherein said hole is plated.

7. A connecting/disconnecting element according to claim 1, wherein said hole is a through hole.

8. An electrical device comprising:
   a housing including a PCB with at least one component mechanically held on said PCB and electrically linked to a ground plane of said PCB, and a connecting/disconnecting element for retaining said component on said PCB, said connecting/disconnecting element having at least one longitudinal arm with a first end engaged through a plated through hole in said PCB, wherein shape of said first end is adapted to be engaged through said plated through hole and disengaged from said plated through hole only when said longitudinal arm is extending substantially perpendicular to the plane of the PCB, and
   a second opposite end, said element being clipped onto said PCB whilst bridging the component with said longitudinal arm extending in a retaining position parallel to the plane of the PCB and to a top surface of said component, wherein said hole has an electrically conductive surface, in that said top surface comprises an electrical conductive part, and in that said connecting/disconnecting element is made of electrical conductive material, said longitudinal arm being in contact, in said retaining position, with said electrical conductive part of said top surface, and said first end being in contact in said retaining position, with said electrically conductive surface of said hole, thus achieving both mechanical holding of component and electrical connection to ground.

9. An electrical device according to claim 8, wherein said component is mounted near to an edge of said PCB, and in that said second opposite end is clipped on said edge.

10. An electrical device according to claim 8, wherein said connecting/disconnecting element is made from wire.

11. An electrical device according to claim 10, wherein said connecting/disconnecting element further comprises two longitudinal arms each of which provided with a first end adapted to be engaged in a corresponding plated through hole of the PCB.

12. An electrical device according to claim 8, wherein said connecting/disconnecting element is made from metal strip.

13. An electrical device according to claim 8, wherein said component has an external housing made of electrical conductive material.

14. An electrical device according to claim 8, wherein said hole is plated.

15. An electrical device according to claim 8, wherein said hole is a through hole.

16. An electrical device according to claim 10, wherein said electrical device constitutes a utility metering device, and in that said housing further comprises a cover fitted above the PCB with the component and the connecting/disconnecting element, the height under the cover being such that said element cannot be moved back to a position in which the first end can be disengaged, should the second end become un-clipped.

17. An electrical device according to claim 8, wherein said electrical device constitutes a utility metering device, and in that said component is a modem.

18. A connecting/disconnecting element for retaining a component on a PCB, said connecting/disconnecting element comprising:
 two longitudinal arms each of which is provided with a first end adapted to engage through a plated through hole in said PCB, wherein the shape of each said first end is adapted to be engaged through said plated through hole and disengaged from said plated through hole only when said longitudinal arm is extending substantially perpendicular to the plane of the PCB, and
 a second opposite end, said element being adapted for removable clip onto said PCB whilst bridging the component with said longitudinal arm extending in a retaining position parallel to the plane of the PCB and to a top surface of said component, wherein said element is made of electrical conductive material, in that said longitudinal arm is adapted to be in contact, in said retaining position, with an electrical conductive part of said top surface, and in that said hole has an electrically conductive surface with which said first end is adapted to be in contact with in said retaining position, thus achieving both mechanical holding of component and electrical connection to ground;
 wherein said connecting/disconnecting element is made from wire.

19. An electrical device comprising:
 a housing including a PCB with at least one component mechanically held on said PCB and electrically linked to a ground plane of said PCB;
 a connecting/disconnecting element for retaining said component on said PCB, said connecting/disconnecting element having at least one longitudinal arm with,
 a first end engaged through a plated through hole in said PCB, wherein shape of said first end is adapted to be engaged through said plated through hole and disengaged from said plated through hole only when said longitudinal arm is extending substantially perpendicular to the plane of the PCB, and
 a second opposite end, said element being clipped onto said PCB whilst bridging the component with said longitudinal arm extending in a retaining position parallel to the plane of the PCB and to a top surface of said component, wherein said hole has an electrically conductive surface, in that said top surface comprises an electrical conductive part, and in that said connecting/disconnecting element is made of electrical conductive material, said longitudinal arm being in contact, in said retaining position, with said electrical conductive part of said top surface, and said first end being in contact in said retaining position, with said electrically conductive surface of said hole, thus achieving both mechanical holding of component and electrical connection to ground;
 wherein said connecting/disconnecting element is made of wire, and
 said connecting/disconnecting element further comprises two longitudinal arms each of which provided with a first end adapted to be engaged in a corresponding plated through hole of the PCB;
 wherein said electrical device constitutes a utility metering device, and in that said housing further comprises a cover fitted above the PCB with the component and said connecting/disconnecting element, the height under the cover being such that said element cannot be moved back to a position in which the first end can be disengaged, should the second end become un-clipped; and
 wherein said electrical device constitutes a utility metering device, and in that said component is a modem.

20. An electrical device comprising:
 a housing including a PCB with at least one component mechanically held on said PCB and electrically linked to a ground plane of said PCB, and a connecting/disconnecting element for retaining said component on said PCB, said connecting/disconnecting element having at least one longitudinal arm with
 a first end engaged through a plated through hole in said PCB, wherein shape of said first end is adapted to be engaged through said plated through hole and disengaged from said plated through hole only when said longitudinal arm is extending substantially perpendicular to the plane of the PCB, and
 a second opposite end, said element being clipped onto said PCB whilst bridging the component with said longitudinal arm extending in a retaining position parallel to the plane of the PCB and to a top surface of said component, wherein said hole has an electrically conductive surface, in that said top surface comprises an electrical conductive part, and in that said connecting/disconnecting element is made of electrical conductive material, said longitudinal arm being in contact, in said retaining position, with said electrical conductive part of said top surface, and said first end being in contact in said retaining position, with said electrically conductive surface of said hole, thus achieving both mechanical holding of component and electrical connection to ground;
 wherein said connecting/disconnecting element is made from wire; and wherein said connecting/disconnecting element further comprises two longitudinal arms each of which provided with a first end adapted to be engaged in a corresponding plated through hole of the PCB.

21. An electrical device comprising:

a housing including a PCB with at least one component mechanically held on said PCB and electrically linked to a ground plane of said PCB, and a connecting/disconnecting element for retaining said component on said PCB, said connecting/disconnecting element having at least one longitudinal arm with a first end engaged through a plated through hole in said PCB, wherein shape of said first end is adapted to be engaged through said plated through hole and disengaged from said plated through hole only when said longitudinal arm is extending substantially perpendicular to the plane of the PCB, and a second opposite end, said element being clipped onto said PCB whilst bridging the component with said longitudinal arm extending in a retaining position parallel to the plane of the PCB and to a top surface of said component, wherein said hole has an electrically conductive surface, in that said top surface comprises an electrical conductive part, and in that said connecting/disconnecting element is made of electrical conductive material, said longitudinal arm being in contact, in said retaining position, with said electrical conductive part of said top surface, and said first end being in contact in said retaining position, with said electrically conductive surface of said hole, thus achieving both mechanical holding of component and electrical connection to ground;

wherein said connecting/disconnecting element is made from wire; and wherein said electrical device constitutes a utility metering device, and in that said housing further comprises a cover fitted above the PCB with the component and the connecting/disconnecting element, the height under the cover being such that said element cannot be moved back to a position in which the first end can be disengaged, should the second end become un-clipped.

22. An electrical device comprising:

a housing including a PCB with at least one component mechanically held on said PCB and electrically linked to a ground plane of said PCB, and a connecting/disconnecting element for retaining said component on said PCB, said connecting/disconnecting element having at least one longitudinal arm with a first end engaged through a plated through hole in said PCB, wherein shape of said first end is adapted to be engaged through said plated through hole and disengaged from said plated through hole only when said longitudinal arm is extending substantially perpendicular to the plane of the PCB, and a second opposite end, said element being clipped onto said PCB whilst bridging the component with said longitudinal arm extending in a retaining position parallel to the plane of the PCB and to a top surface of said component, wherein said hole has an electrically conductive surface, in that said top surface comprises an electrical conductive part, and in that said connecting/disconnecting element is made of electrical conductive material, said longitudinal arm being in contact, in said retaining position, with said electrical conductive part of said top surface, and said first end being in contact in said retaining position, with said electrically conductive surface of said hole, thus achieving both mechanical holding of component and electrical connection to ground;

wherein said electrical device constitutes a utility metering device, and in that said component is a modem.

* * * * *